United States Patent
Yoshino et al.

(10) Patent No.: US 12,371,778 B2
(45) Date of Patent: Jul. 29, 2025

(54) COBALT COMPOUND, THIN-FILM FORMING RAW MATERIAL, THIN-FILM, AND METHOD OF PRODUCING THIN-FILM

(71) Applicant: ADEKA CORPORATION, Tokyo (JP)

(72) Inventors: Tomoharu Yoshino, Tokyo (JP); Keisuke Takeda, Tokyo (JP); Atsushi Yamashita, Tokyo (JP)

(73) Assignee: ADEKA CORPORATION, Tokyo (JP)

( * ) Notice: Subject to any disclaimer, the term of this patent is extended or adjusted under 35 U.S.C. 154(b) by 0 days.

(21) Appl. No.: 18/575,963

(22) PCT Filed: Jun. 28, 2022

(86) PCT No.: PCT/JP2022/025669
§ 371 (c)(1),
(2) Date: Jan. 2, 2024

(87) PCT Pub. No.: WO2023/286589
PCT Pub. Date: Jan. 19, 2023

(65) Prior Publication Data
US 2024/0337014 A1    Oct. 10, 2024

(30) Foreign Application Priority Data
Jul. 12, 2021 (JP) .................. 2021-115006

(51) Int. Cl.
| | | |
|---|---|---|
| *C07F 15/06* | (2006.01) | |
| *C23C 16/18* | (2006.01) | |
| *C23C 16/448* | (2006.01) | |
| *C23C 16/455* | (2006.01) | |

(52) U.S. Cl.
CPC ............ *C23C 16/18* (2013.01); *C07F 15/065* (2013.01); *C23C 16/4485* (2013.01); *C23C 16/45553* (2013.01)

(58) Field of Classification Search
CPC .. C07F 15/065; C23C 16/45553; C23C 16/18
See application file for complete search history.

(56) References Cited

U.S. PATENT DOCUMENTS

| | | | |
|---|---|---|---|
| 7,557,229 B2 | 7/2009 | Gordon et al. | |
| 12,104,245 B2* | 10/2024 | Sakurai | C07F 15/045 |
| 12,275,748 B2* | 4/2025 | Yoshino | C01B 33/027 |
| 2005/0064706 A1* | 3/2005 | Kim | H10D 30/0212 |
| | | | 438/681 |
| 2006/0141155 A1* | 6/2006 | Gordon | C23C 16/40 |
| | | | 427/255.394 |
| 2013/0023669 A1* | 1/2013 | Korolev | C07F 13/005 |
| | | | 548/402 |
| 2013/0251903 A1 | 9/2013 | Han | |
| 2022/0017553 A1 | 1/2022 | Oike et al. | |

FOREIGN PATENT DOCUMENTS

| | | |
|---|---|---|
| JP | 2006-511716 A | 4/2006 |
| JP | 2013-545755 A | 12/2013 |
| JP | 2021-11468 A | 2/2021 |
| WO | 2012/067439 A2 | 5/2012 |
| WO | 2021/085210 A1 | 5/2021 |

OTHER PUBLICATIONS

International Search Report dated Aug. 30, 2022 in International Bureau of WIPO Patent Application No. PCT/JP2022/025669 with an English translation thereof.
Written Opinion dated Aug. 30, 2022 in International Bureau of WIPO Patent Application No. PCT/JP2022/025669 with an English translation thereof.

* cited by examiner

*Primary Examiner* — Alexander R Pagano
*Assistant Examiner* — Frank S. Hou
(74) *Attorney, Agent, or Firm* — GREENBLUM & BERNSTEIN, P.L.C.

(57) ABSTRACT

Provided is a cobalt compound represented by the following general formula (1):

$$\text{(1)}$$

where $R^1$ to $R^7$ each independently represent a hydrogen atom, a halogen atom, an alkyl group having 1 to 5 carbon atoms, a fluorine atom-containing alkyl group having 1 to 5 carbon atoms, a group represented by the following general formula (L-1), or a group represented by the following general formula (L-2);

$$*-A^1-N\begin{matrix}R^8\\ R^9\end{matrix} \quad \text{(L-1)}$$

$$*-A^2-O-R^{10} \quad \text{(L-2)}$$

where $R^8$ to $R^{10}$ each independently represent an alkyl group having 1 to 5 carbon atoms, $A^1$ and $A^2$ each independently represent an alkanediyl group having 1 to 5 carbon atoms, and * represents a bonding site.

7 Claims, 4 Drawing Sheets

COBALT COMPOUND, THIN-FILM FORMING RAW MATERIAL, THIN-FILM, AND METHOD OF PRODUCING THIN-FILM

TECHNICAL FIELD

The present invention relates to a cobalt compound, a thin-film forming raw material containing the cobalt compound, a thin-film, and a method of producing a thin-film including using the thin-film forming raw material.

BACKGROUND ART

A thin-film containing a cobalt atom has been used for an electrode film, a resistance film, a magnetic tape, a cemented carbide tool member, or the like.

As a method of producing the thin-film, there are given, for example, a sputtering method, an ion plating method, MOD methods, such as a coating thermal decomposition method and a sol-gel method, and chemical vapor deposition methods. Of those, chemical vapor deposition (hereinafter sometimes simply referred to as "CVD") methods including an atomic layer deposition (ALD) method are optimum production processes because the methods each have many advantages, such as excellent composition controllability and step coverage, suitability for mass production, and capability of hybrid integration.

A large number of various raw materials have each been reported as a cobalt atom supply source to be used in the chemical vapor deposition method. In, for example, Patent Document 1, there is a disclosure of a method of forming a thin-film including using a volatile cobalt amidinate. In addition, in Patent Document 2, there is a disclosure of a diazadiene-based cobalt compound which can be used in the chemical vapor deposition method or the atomic layer deposition method.

CITATION LIST

Patent Document

Patent Document 1: JP 2006-511716 A
Patent Document 2: JP 2013-545755 A

SUMMARY OF INVENTION

Technical Problem

In a method including vaporizing a compound to form a thin-film such as the CVD method, the compound (precursor) to be used as a thin-film forming raw material is required to satisfy an important property of being able to produce a high-quality thin-film. However, the related-art cobalt compound has not sufficiently satisfied that property.

Accordingly, an object of the present invention is to provide a cobalt compound which can produce a high-quality thin-film when used as a thin-film forming raw material.

Solution to Problem

The inventors of the present invention have made investigations and have found that the above-mentioned problem can be solved by a cobalt compound having a specific structure to reach the present invention.

That is, according to one embodiment of the present invention, there is provided a cobalt compound represented by the following general formula (1):

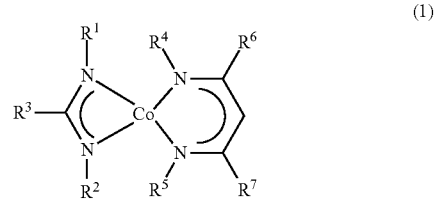

where $R^1$ to $R^7$ each independently represent a hydrogen atom, a halogen atom, an alkyl group having 1 to 5 carbon atoms, a fluorine atom-containing alkyl group having 1 to 5 carbon atoms, a group represented by the following general formula (L-1), or a group represented by the following general formula (L-2);

where $R^8$ to $R^{10}$ each independently represent an alkyl group having 1 to 5 carbon atoms, $A^1$ and $A^2$ each independently represent an alkanediyl group having 1 to 5 carbon atoms, and * represents a bonding site.

According to one embodiment of the present invention, there is provided a thin-film forming raw material, including the above-mentioned cobalt compound.

According to one embodiment of the present invention, there is provided a method of producing a thin-film, including forming a thin-film containing a cobalt atom (hereinafter sometimes referred to as "cobalt-containing thin-film") on a surface of a substrate through use of the above-mentioned thin-film forming raw material.

A compound represented by the following general formula (2) is identical in meaning to the compound represented by the general formula (1):

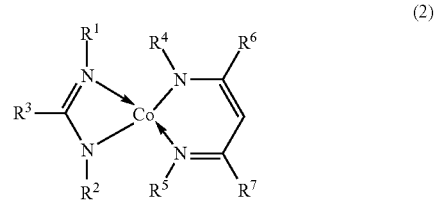

where $R^1$ to $R^7$ each independently represent a hydrogen atom, a halogen atom, an alkyl group having 1 to 5 carbon atoms, a fluorine atom-containing alkyl group having 1 to 5 carbon atoms, a group represented by the following general formula (L-1), or a group represented by the following general formula (L-2);

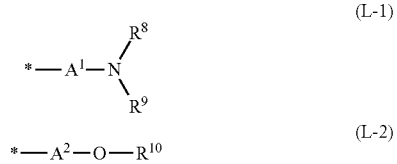

where $R^8$ to $R^{10}$ each independently represent an alkyl group having 1 to 5 carbon atoms, $A^1$ and $A^2$ each independently represent an alkanediyl group having 1 to 5 carbon atoms, and * represents a bonding site.

Advantageous Effects of Invention

According to the present invention, the cobalt compound, which can produce a high-quality thin-film with satisfactory productivity when used as a thin-film forming raw material, can be provided.

DESCRIPTION OF EMBODIMENTS

Figure 1:
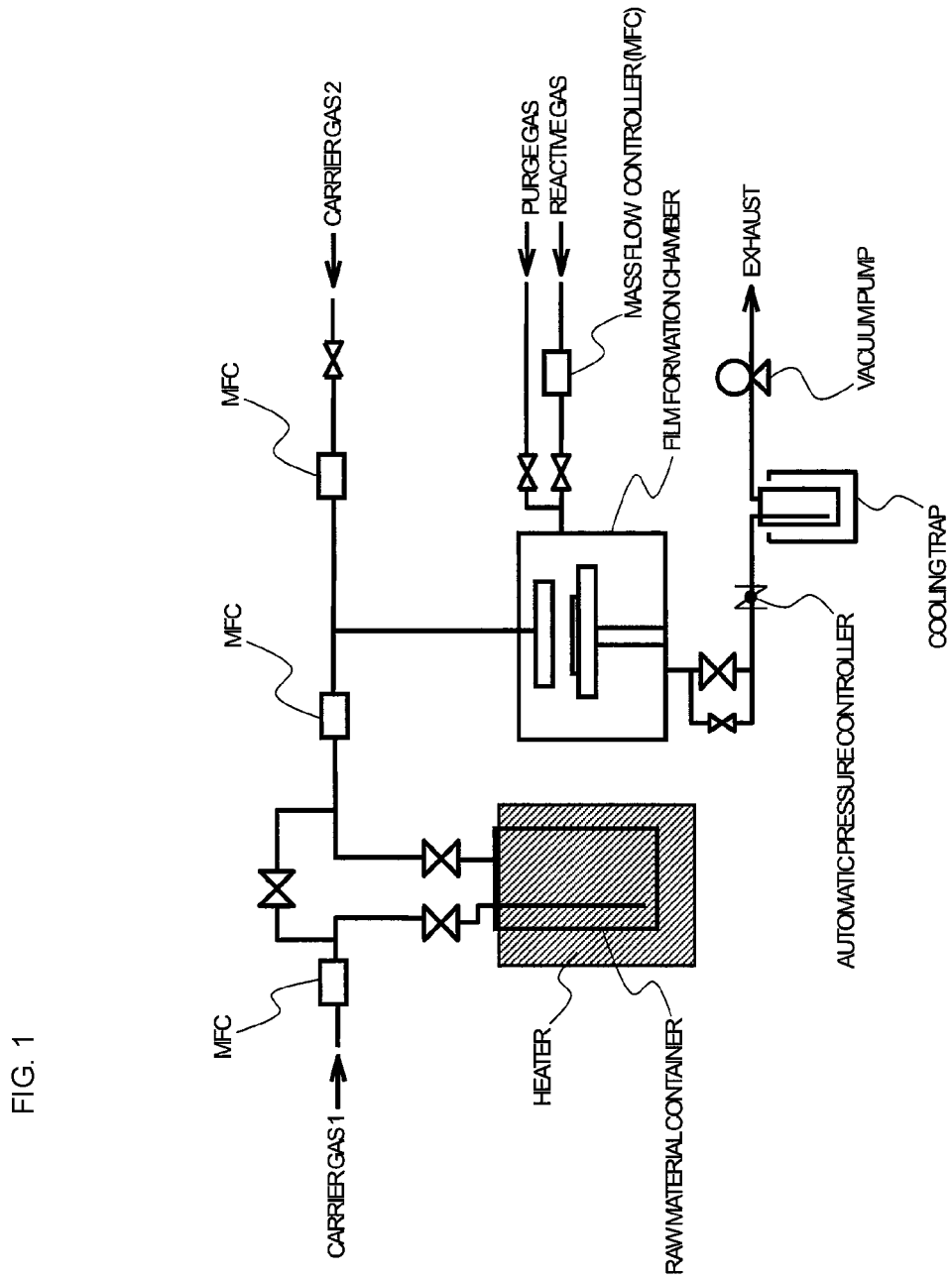
FIG. 1 is a schematic diagram for illustrating an example of an ALD apparatus to be used in a method of producing a thin-film according to the present invention.

A cobalt compound of the present invention is represented by the general formula (1). The cobalt compound represented by the general formula (1) (hereinafter sometimes referred to as "cobalt compound of the present invention") is suitable as a precursor in a method of producing a thin-film including a vaporization step such as an ALD method, which is one kind of CVD method.

In the general formula (1), $R^1$ to $R^7$ each independently represent a hydrogen atom, a halogen atom, an alkyl group having 1 to 5 carbon atoms, a fluorine atom-containing alkyl group having 1 to 5 carbon atoms, a group represented by the general formula (L-1), or a group represented by the general formula (L-2).

In the general formulae (L-1) and (L-2), $R^8$ to $R^{10}$ each independently represent an alkyl group having 1 to 5 carbon atoms, $A^1$ and $A^2$ each independently represent an alkanediyl group having 1 to 5 carbon atoms, and * represents a bonding site.

Examples of the "halogen atom" include a fluorine atom, a chlorine atom, and a bromine atom.

Examples of the "alkyl group having 1 to 5 carbon atoms" include a methyl group, an ethyl group, a propyl group, an isopropyl group, a butyl group, an isobutyl group, a secondary butyl group, a tertiary butyl group, a pentyl group, an isopentyl group, and a neopentyl group.

Examples of the "fluorine atom-containing alkyl group having 1 to 5 carbon atoms" include a monofluoromethyl group, a difluoromethyl group, a trifluoromethyl group, a trifluoroethyl group, a trifluoropropyl group, a dimethyl trifluoroethyl group, a (trifluoromethyl)tetrafluoroethyl group, and a nonafluoro-tert-butyl group.

Examples of the "alkanediyl group having 1 to 5 carbon atoms" include a methylene group, an ethylene group, a propane-1,3-diyl group, a propane-1,2-diyl group, a butane-1,4-diyl group, a butane-1,3-diyl group, a butane-2,3-diyl group, a butane-1,2-diyl group, a pentane-1,1-diyl group, a pentane-1,2-diyl group, a pentane-1,3-diyl group, a pentane-1,4-diyl group, and a pentane-1,5-diyl group.

In the general formula (1), $R^1$ to $R^7$ are each appropriately selected in accordance with a method of producing a thin-film to which the cobalt compound is applied. When the cobalt compound is used in a method of producing a thin-film including a vaporization step, it is preferred to select $R^1$ to $R^7$ so that the cobalt compound has a high vapor pressure and a low melting point.

For example, in the general formula (1), $R^1$, $R^2$, $R^4$, and $R^5$ preferably each independently represent an alkyl group having 1 to 5 carbon atoms, a fluorine atom-containing alkyl group having 1 to 5 carbon atoms, a group represented by the general formula (L-1), or a group represented by the general formula (L-2), and $R^3$, $R^6$, and $R^7$ preferably each independently represent a hydrogen atom, a halogen atom, or an alkyl group having 1 to 5 carbon atoms.

In addition, $R^1$ and $R^2$ each independently represent preferably an alkyl group having 1 to 5 carbon atoms or a fluorine atom-containing alkyl group having 1 to 5 carbon atoms, more preferably an alkyl group having 2 to 4 carbon atoms or a fluorine atom-containing alkyl group having 2 to 4 carbon atoms, still more preferably an ethyl group, an isopropyl group, a tertiary butyl group, or a trifluoroethyl group, particularly preferably an isopropyl group because the cobalt compound of the present invention has a high vapor pressure, has high thermal stability, and can produce a high-quality thin-film with satisfactory productivity when used as a thin-film forming raw material.

$R^3$ represents preferably a hydrogen atom or an alkyl group having 1 to 5 carbon atoms, more preferably a hydrogen atom or an alkyl group having 1 to 3 carbon atoms, particularly preferably a methyl group because the cobalt compound of the present invention has a low melting point, has a high vapor pressure, and can produce a high-quality thin-film with satisfactory productivity when used as a thin-film forming raw material.

$R^4$ and $R^5$ each independently represent preferably an alkyl group having 1 to 5 carbon atoms, a group represented by the general formula (L-1), or a group represented by the general formula (L-2), more preferably an alkyl group having 1 to 5 carbon atoms or a group represented by the general formula (L-1), still more preferably an alkyl group having 1 to 5 carbon atoms, particularly preferably an alkyl group having 1 to 3 carbon atoms, most preferably an ethyl group because the cobalt compound of the present invention has a low melting point, and can produce a high-quality thin-film with satisfactory productivity when used as a thin-film forming raw material.

$R^6$ and $R^7$ each independently represent preferably an alkyl group having 1 to 5 carbon atoms, more preferably an alkyl group having 1 to 3 carbon atoms, particularly preferably a methyl group because the cobalt compound of the present invention has a high vapor pressure, has high thermal stability, and can produce a high-quality thin-film with satisfactory productivity when used as a thin-film forming raw material.

$R^8$ to $R^{10}$ each independently represent preferably an alkyl group having 1 to 3 carbon atoms, more preferably a methyl group or an ethyl group, particularly preferably a methyl group because the cobalt compound of the present invention has a low melting point, has a high vapor pressure, and can produce a high-quality thin-film with satisfactory productivity when used as a thin-film forming raw material. $A^1$ and $A^2$ each independently represent preferably an alkanediyl group having 2 or 3 carbon atoms, more preferably an ethylene group because the cobalt compound has a low melting point, and can produce a high-quality thin-film with satisfactory productivity when used as a thin-film forming raw material.

In addition, when the cobalt compound is used in a method of producing a thin-film by a MOD method free of any vaporization step, $R^1$ to $R^{10}$, $A^1$, and $A^2$ may each be arbitrarily selected in accordance with, for example, solubility in a solvent to be used and a thin-film formation reaction.

Preferred specific examples of the cobalt compound represented by the general formula (1) include Cobalt Compounds No. 1 to No. 96 below. In Cobalt Compounds No. 1 to No. 96 below, "Me" represents a methyl group, "Et" represents an ethyl group, "iPr" represents an isopropyl group, "iBu" represents an isobutyl group, and "tBu" represents a tertiary butyl group.

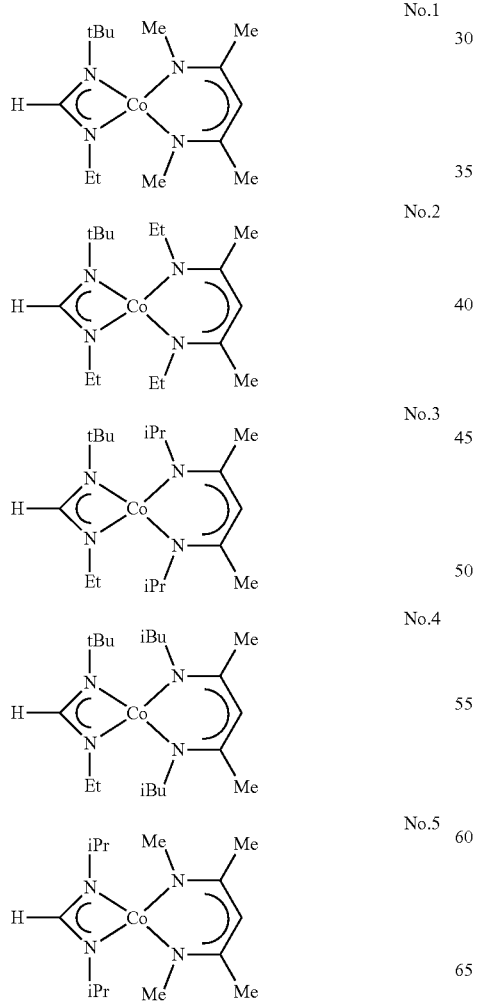

No.1

No.2

No.3

No.4

No.5

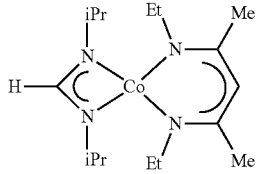

No.6

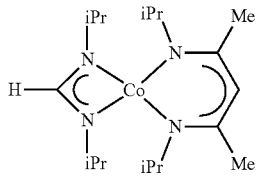

No.7

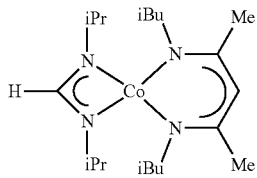

No.8

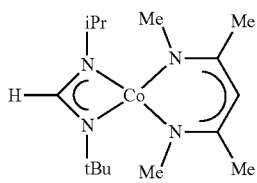

No.9

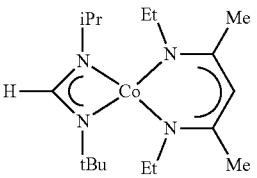

No.10

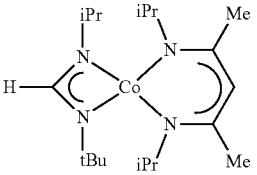

No.11

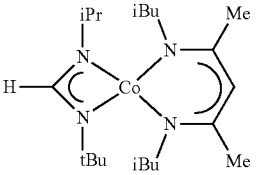

No.12

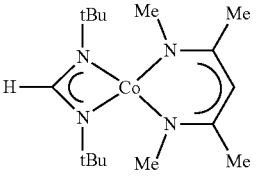

No.13

-continued
No.14
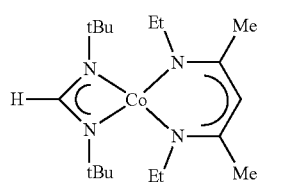
No.15
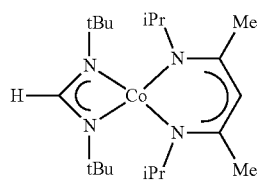
No.16
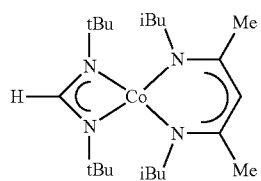
No.17
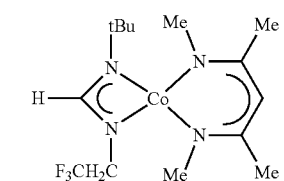
No.18
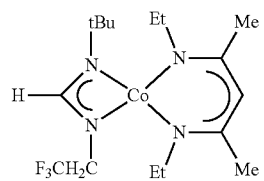
No.19
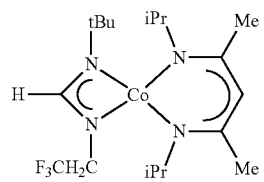
No.20
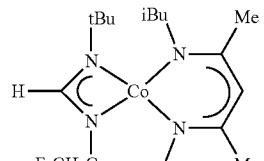
No.21
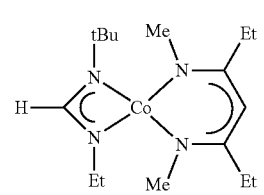
-continued
No.22
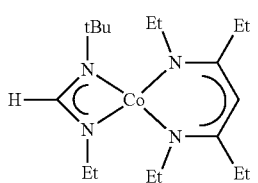
No.23
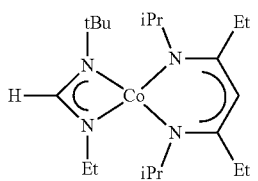
No.24
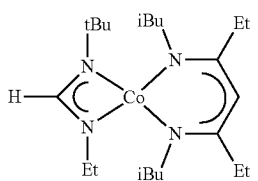
No.25
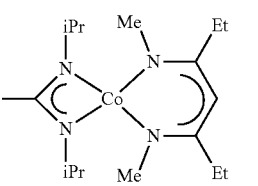
No.26
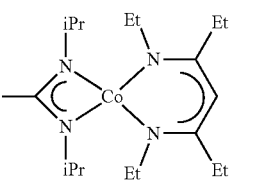
No.27
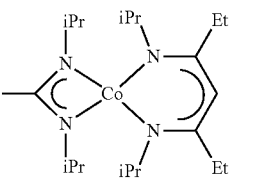
No.28
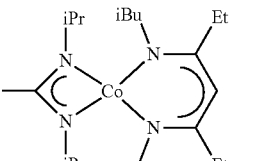
No.29
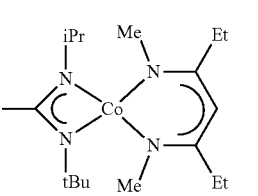

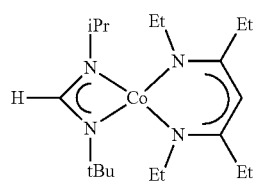
No.30
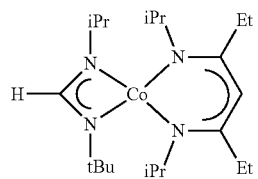
No.31
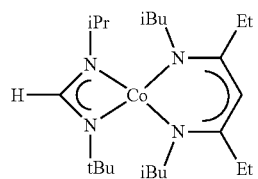
No.32
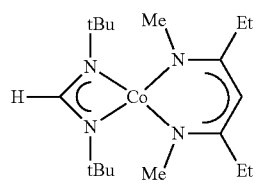
No.33
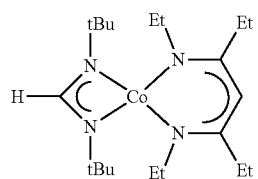
No.34
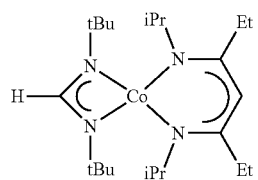
No.35
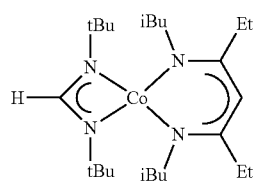
No.36
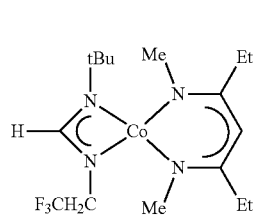
No.37
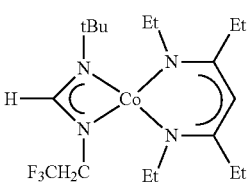
No.38
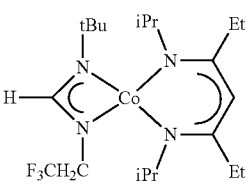
No.39
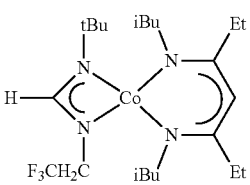
No.40
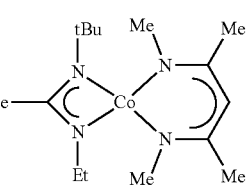
No.41
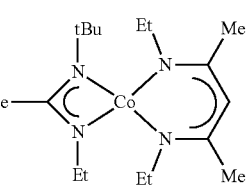
No.42
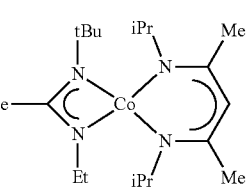
No.43
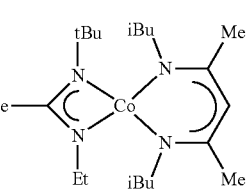
No.44
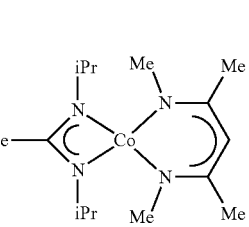
No.45

No.46
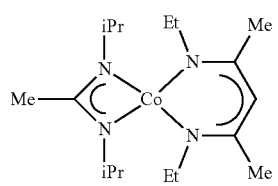
No.47
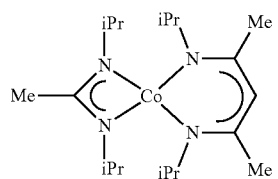
No.48
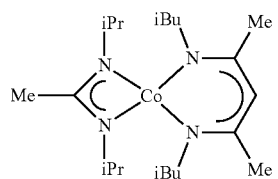
No.49
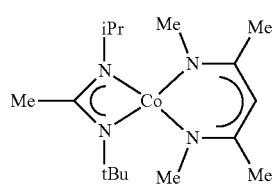
No.50
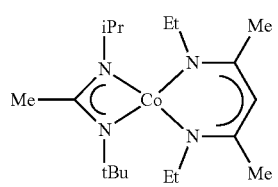
No.51
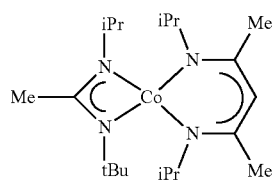
No.52
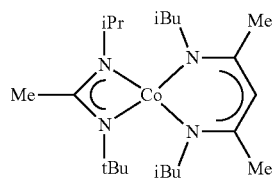
No.53
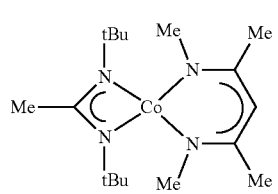
No.54
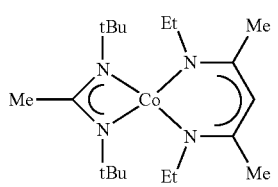
No.55
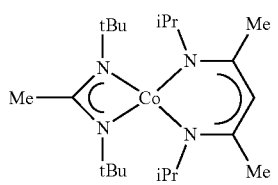
No.56
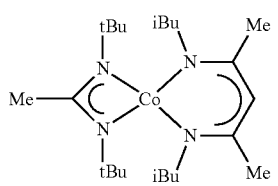
No.57
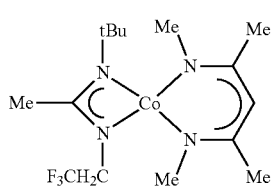
No.58
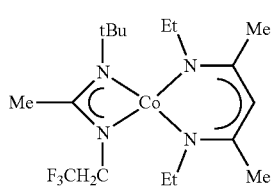
No.59
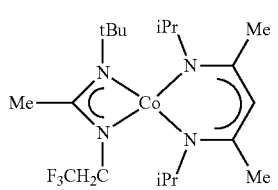
No.60
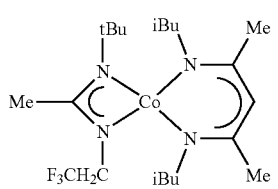
No.61
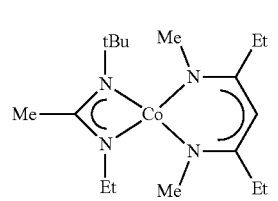

-continued
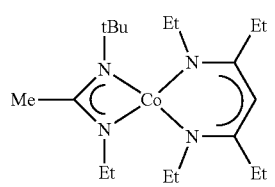
No.62
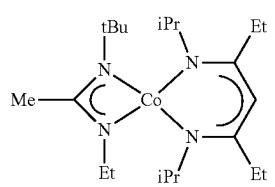
No.63
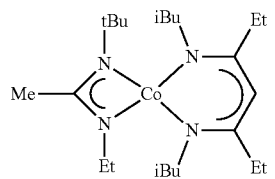
No.64
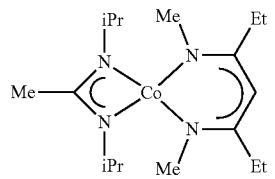
No.65
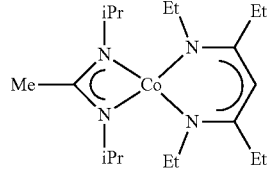
No.66
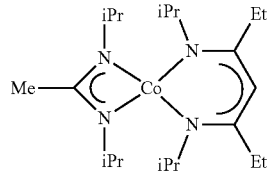
No.67
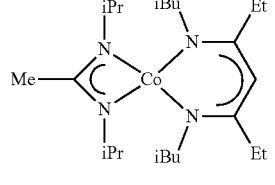
No.68
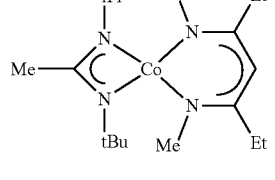
No.69
-continued
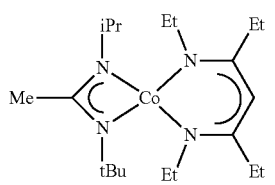
No.70
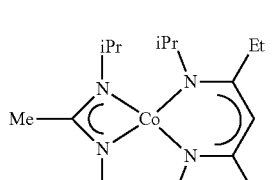
No.71
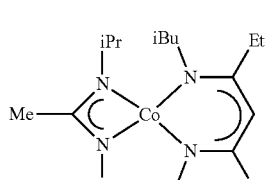
No.72
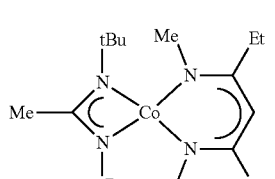
No.73
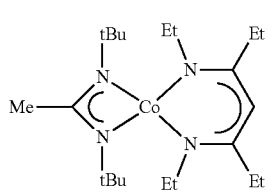
No.74
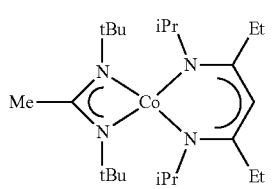
No.75
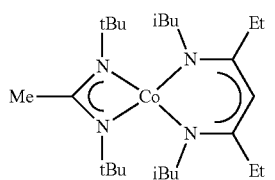
No.76
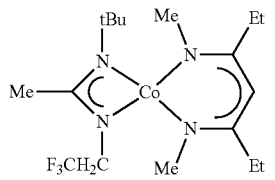
No.77

-continued
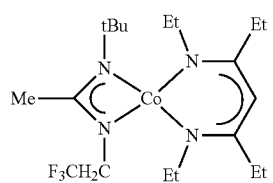
No.78
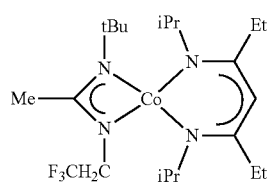
No.79
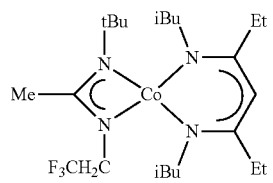
No.80
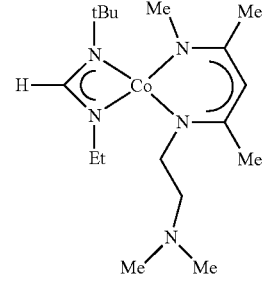
No.81
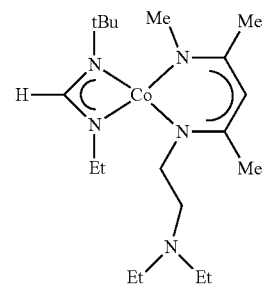
No.82
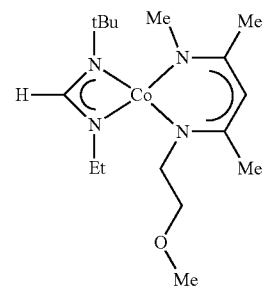
No.83
-continued
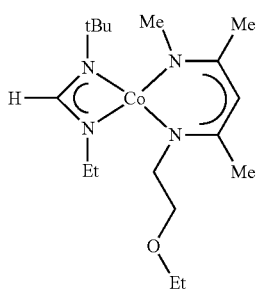
No.84
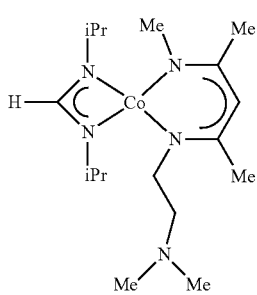
No.85
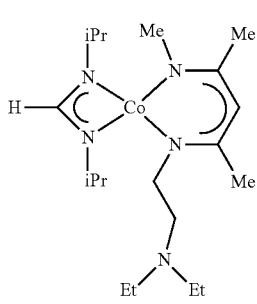
No.86
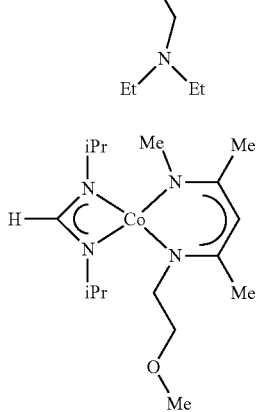
No.87
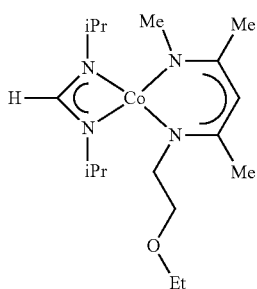
No.88

No.89 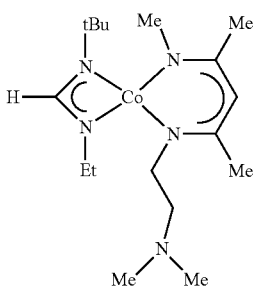

No.90 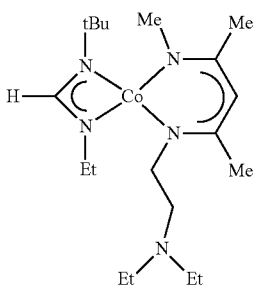

No.91 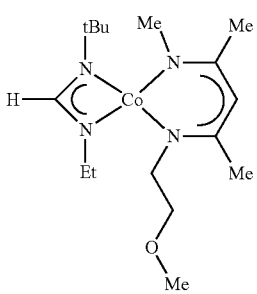

No.92 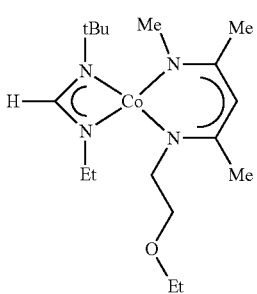

No.93 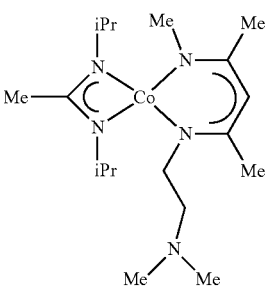

No.94 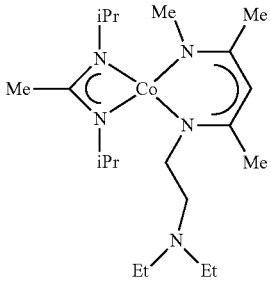

No.95 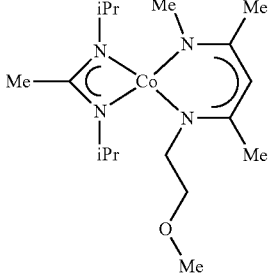

No.96 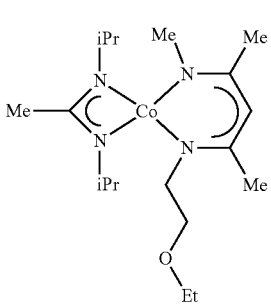

A method of producing the cobalt compound represented by the general formula (1) is not particularly limited, and the cobalt compound is produced by applying a well-known reaction. For example, cobalt(II) chloride, an imide compound having a corresponding structure, and an alkyllithium are caused to react with one another under a tetrahydrofuran solvent, and then an imine compound having a corresponding structure and an alkyllithium are further caused to react therewith. After that, exchange of the solvent, filtration, removal of the solvent, and distillation purification are performed. Thus, the cobalt compound represented by the general formula (1) can be obtained.

Examples of the imide compound include (N-tert-butyl-N'-ethyl)acetamidine, (N-tert-butyl-N'-ethyl)propionamidine, diisopropylcarbodiimide, (N-tert-butyl-N'-isopropyl)acetamidine, (N-tert-butyl-N'-isopropyl)propionamidine, di-tert-butylcarbodiimide, (N-tert-butyl-N'-1,1,1-trifluoroethyl)acetamidine, and (N-tert-butyl-N'-1-dimethylaminoethyl)acetamidine.

Examples of the imine compound include N,N-diethylpentane-2,4-diimine, N,N-dimethylpentane-2,4-diimine, N,N-diisopropylpentane-2,4-diimine, N,N-diisobutylpentane-2,4-diimine, N,N-di-sec-butylpentane-2,4-diimine, N-methyl-N'-(2-dimethylaminoethyl)pentane-2,4-diimine, N,N-diethylheptane-3,5-diimine, N,N-dimethylheptane-3,5-diimine, N,N-diethyl-1,1,1-trifluoropentane-2,4-diimine, and N,N-dimethyl-1,1,1-trifluoropentane-2,4-diimine.

Next, a thin-film forming raw material of the present invention is described. The thin-film forming raw material of the present invention contains the cobalt compound represented by the general formula (1) as a precursor of a thin-film. The form of the thin-film forming raw material varies depending on a production process to which the thin-film forming raw material is applied. For example, when a thin-film containing only a cobalt atom as a metal is produced, the thin-film forming raw material of the present invention is free of a metal compound other than the cobalt compound represented by the general formula (1) and a semimetal compound. Meanwhile, when a thin-film containing two or more kinds of metals and/or a semimetal is produced, the thin-film forming raw material of the present invention may contain a compound containing a desired metal and/or a compound containing the semimetal (hereinafter sometimes referred to as "other precursor") in addition to the cobalt compound represented by the general formula (1). The thin-film forming raw material of the present invention may further contain an organic solvent and/or a nucleophilic reagent as described later. As described above, the physical properties of the cobalt compound represented by the general formula (1) serving as the precursor are suitable for a CVD method, and hence the thin-film forming raw material of the present invention is useful as a chemical vapor deposition raw material (hereinafter sometimes referred to as "CVD raw material"). The thin-film forming raw material of the present invention is particularly suitable for the ALD method because the cobalt compound represented by the general formula (1) has an ALD window.

When the thin-film forming raw material of the present invention is a chemical vapor deposition raw material, the form thereof is appropriately selected depending on, for example, a transportation and supply method of the CVD method to be used.

As the above-mentioned transportation and supply method, there are given a gas transportation method and a liquid transportation method. The gas transportation method involves heating and/or decompressing the CVD raw material in a container in which the raw material is stored (hereinafter sometimes referred to as "raw material container"), to thereby vaporize the raw material to obtain a raw material gas, and introducing the raw material gas into a film formation chamber (hereinafter sometimes referred to as "deposition reaction portion") having a substrate set therein together with a carrier gas, such as argon, nitrogen, or helium, to be used as required. The liquid transportation method involves transporting the CVD raw material to a vaporization chamber under the state of a liquid or a solution, heating and/or decompressing the raw material in the vaporization chamber, to thereby vaporize the raw material to obtain a raw material gas, and introducing the raw material gas into the film formation chamber. In the case of the gas transportation method, the cobalt compound represented by the general formula (1) itself may be used as the CVD raw material. In the case of the liquid transportation method, the cobalt compound represented by the general formula (1) itself or a solution obtained by dissolving the cobalt compound in an organic solvent may be used as the CVD raw material. Any such CVD raw material may further contain the other precursor, a nucleophilic reagent, and the like.

In addition, in a multi-component CVD method, there are given a method involving vaporizing and supplying the CVD raw material independently for each component (hereinafter sometimes referred to as "single source method"), and a method involving vaporizing and supplying a mixed raw material obtained by mixing a multi-component raw material with desired composition in advance (hereinafter sometimes referred to as "cocktail source method"). In the case of the cocktail source method, a mixture of the cobalt compound represented by the general formula (1) and the other precursor or a mixed solution obtained by dissolving the mixture in an organic solvent may be used as the CVD raw material. The mixture or the mixed solution may further contain a nucleophilic reagent and the like.

There is no particular limitation on the above-mentioned organic solvent, and a well-known general organic solvent may be used. Examples of the organic solvent include: acetic acid esters, such as ethyl acetate, butyl acetate, and methoxyethyl acetate; ethers, such as tetrahydrofuran, tetrahydropyran, ethylene glycol dimethyl ether, diethylene glycol dimethyl ether, triethylene glycol dimethyl ether, dibutyl ether, and dioxane; ketones, such as methyl butyl ketone, methyl isobutyl ketone, ethyl butyl ketone, dipropyl ketone, diisobutyl ketone, methyl amyl ketone, cyclohexanone, and methylcyclohexanone; hydrocarbons, such as hexane, cyclohexane, methylcyclohexane, dimethylcyclohexane, ethylcyclohexane, heptane, octane, toluene, and xylene; hydrocarbons each having a cyano group, such as 1-cyanopropane, 1-cyanobutane, 1-cyanohexane, cyanocyclohexane, cyanobenzene, 1,3-dicyanopropane, 1,4-dicyanobutane, 1,6-dicyanohexane, 1,4-dicyanocyclohexane, and 1,4-dicyanobenzene; and pyridine and lutidine. Those organic solvents may be used alone or as a mixture thereof depending on the solubility of a solute, a relationship among the use temperature, boiling point, and flash point of each of the solvents, and the like.

When the thin-film forming raw material of the present invention is a mixed solution with the above-mentioned organic solvent, the amount of the entire precursors in the thin-film forming raw material is preferably from 0.01 mol/liter to 2.0 mol/liter, more preferably from 0.05 mol/liter to 1.0 mol/liter because the thin-film can be produced with satisfactory productivity.

When the thin-film forming raw material of the present invention is free of a metal compound other than the cobalt compound represented by the general formula (1) and a semimetal compound, the amount of the entire precursors herein means the amount of the cobalt compound represented by the general formula (1). When the thin-film forming raw material of the present invention contains a compound containing another metal and/or a compound containing a semimetal (other precursor) in addition to the cobalt compound represented by the general formula (1), the amount of the entire precursors herein means the total amount of the cobalt compound represented by the general formula (1) and the other precursor.

In addition, in the case of the multi-component CVD method, there is no particular limitation on the other precursor to be used together with the cobalt compound represented by the general formula (1), and a well-known general precursor used in the CVD raw material may be used.

Examples of the other precursor include compounds of one kind or two or more kinds selected from the group consisting of compounds used as organic ligands, such as an alcohol compound, a glycol compound, a β-diketone compound, a cyclopentadiene compound, and an organic amine compound, and silicon or a metal. In addition, examples of the kind of the metal in the other precursor include lithium, sodium, potassium, magnesium, calcium, strontium, barium, titanium, zirconium, hafnium, vanadium, tantalum, chromium, molybdenum, tungsten, manganese, iron, cobalt, rhodium, iridium, nickel, palladium, platinum, copper, silver, gold, zinc, aluminum, germanium, tin, lead, antimony, bismuth, yttrium, lanthanum, cerium, praseodymium, neodymium, promethium, samarium, europium, gadolinium, terbium, dysprosium, holmium, erbium, thulium, ytterbium, ruthenium, and lutetium.

Examples of the alcohol compound to be used as the organic ligand in the above-mentioned other precursor include: alkyl alcohols, such as methanol, ethanol, propanol, isopropyl alcohol, butanol, secondary butyl alcohol, isobutyl alcohol, tertiary butyl alcohol, pentyl alcohol, isopentyl alcohol, and tertiary pentyl alcohol; ether alcohols, such as 2-methoxyethanol, 2-ethoxyethanol, 2-butoxyethanol, 2-(2-methoxyethoxy)ethanol, 2-methoxy-1-methylethanol, 2-methoxy-1,1-dimethylethanol, 2-ethoxy-1,1-dimethylethanol, 2-isopropoxy-1,1-dimethylethanol, 2-butoxy-1,1-dimethylethanol, 2-(2-methoxyethoxy)-1,1-dimethylethanol, 2-propoxy-1,1-diethylethanol, 2-s-butoxy-1,1-diethylethanol, and 3-methoxy-1,1-dimethylpropanol; and dialkylamino alcohols, such as dimethylaminoethanol, ethylmethylaminoethanol, diethylaminoethanol, dimethylamino-2-pentanol, ethylmethylamino-2-pentanol, dimethylamino-2-methyl-2-pentanol, ethylmethylamino-2-methyl-2-pentanol, and diethylamino-2-methyl-2-pentanol.

Examples of the glycol compound to be used as the organic ligand in the above-mentioned other precursor include 1,2-ethanediol, 1,2-propanediol, 1,3-propanediol, 2,4-hexanediol, 2,2-dimethyl-1,3-propanediol, 2,2-diethyl-1,3-propanediol, 1,3-butanediol, 2,4-butanediol, 2,2-diethyl-1,3-butanediol, 2-ethyl-2-butyl-1,3-propanediol, 2,4-pentanediol, 2-methyl-1,3-propanediol, 2-methyl-2,4-pentanediol, 2,4-hexanediol, and 2,4-dimethyl-2,4-pentanediol.

Examples of the β-diketone compound to be used as the organic ligand in the above-mentioned other precursor include: alkyl-substituted β-diketones, such as acetylacetone, hexane-2,4-dione, 5-methylhexane-2,4-dione, heptane-2,4-dione, 2-methylheptane-3,5-dione, 5-methylheptane-2,4-dione, 6-methylheptane-2,4-dione, 2,2-dimethylheptane-3,5-dione, 2,6-dimethylheptane-3,5-dione, 2,2,6-trimethylheptane-3,5-dione, 2,2,6,6-tetramethylheptane-3,5-dione, octane-2,4-dione, 2,2,6-trimethyloctane-3,5-dione, 2,6-dimethyloctane-3,5-dione, 2,9-dimethylnonane-4,6-dione, 2-methyl-6-ethyldecane-3,5-dione, and 2,2-dimethyl-6-ethyldecane-3,5-dione; fluorine-substituted alkyl β-diketones, such as 1,1,1-trifluoropentane-2,4-dione, 1,1,1-trifluoro-5,5-dimethylhexane-2,4-dione, 1,1,1,5,5,5-hexafluoropentane-2,4-dione, and 1,3-diperfluorohexylpropane-1,3-dione; and ether-substituted β-diketones, such as 1,1,5,5-tetramethyl-1-methoxyhexane-2,4-dione, 2,2,6,6-tetramethyl-1-methoxyheptane-3,5-dione, and 2,2,6,6-tetramethyl-1-(2-methoxyethoxy)heptane-3,5-dione.

Examples of the cyclopentadiene compound to be used as the organic ligand in the above-mentioned other precursor include cyclopentadiene, methylcyclopentadiene, ethylcyclopentadiene, propylcyclopentadiene, isopropylcyclopentadiene, butylcyclopentadiene, sec-butylcyclopentadiene, isobutylcyclopentadiene, tert-butylcyclopentadiene, dimethylcyclopentadiene, and tetramethylcyclopentadiene.

Examples of the organic amine compound to be used as the organic ligand in the above-mentioned other precursor include methylamine, ethylamine, propylamine, isopropylamine, butylamine, sec-butylamine, tert-butylamine, isobutylamine, dimethylamine, diethylamine, dipropylamine, diisopropylamine, ethylmethylamine, propylmethylamine, and isopropylmethylamine.

The above-mentioned other precursors are known in the art, and production methods therefor are also known. An example of the production methods is given as described below. When the alcohol compound is used as the organic ligand, the precursor may be produced through a reaction between an inorganic salt of the metal described above or a hydrate thereof and an alkali metal alkoxide of the alcohol compound. In this case, examples of the inorganic salt of the metal or the hydrate thereof may include a halide and a nitrate of the metal. Examples of the alkali metal alkoxide may include a sodium alkoxide, a lithium alkoxide, and a potassium alkoxide.

In the case of the single source method, a compound similar to the cobalt compound represented by the general formula (1) in the behavior of thermal decomposition and/or oxidative decomposition is preferably used as the above-mentioned other precursor. In the case of the cocktail source method, a compound that not only is similar to the cobalt compound represented by the general formula (1) in the behavior of thermal decomposition and/or oxidative decomposition but also does not cause any change impairing desired characteristics as a precursor through a chemical reaction or the like at the time of mixing is preferably used as the above-mentioned other precursor because a high-quality thin-film can be produced with satisfactory productivity.

In addition, the thin-film forming raw material of the present invention may contain a nucleophilic reagent as required in order to impart stability to the cobalt compound represented by the general formula (1) and the other precursor. Examples of the nucleophilic reagent include: ethylene glycol ethers, such as glyme, diglyme, triglyme, and tetraglyme; crown ethers, such as 18-crown-6, dicyclohexyl-18-crown-6, 24-crown-8, dicyclohexyl-24-crown-8, and dibenzo-24-crown-8; polyamines, such as ethylenediamine, N,N'-tetramethylethylenediamine, diethylenetriamine, triethylenetetramine, tetraethylenepentamine, pentaethylenehexamine, 1,1,4,7,7-pentamethyldiethylenetriamine, 1,1,4,7,10,10-hexamethyltriethylenetetramine, and triethoxytriethyleneamine; cyclic polyamines, such as cyclam and cyclen; heterocyclic compounds, such as pyridine, pyrrolidine, piperidine, morpholine, N-methylpyrrolidine, N-methylpiperidine, N-methylmorpholine, tetrahydrofuran, tetrahydropyran, 1,4-dioxane, oxazole, thiazole, and oxathiolane; β-keto esters, such as methyl acetoacetate, ethyl acetoacetate, and 2-methoxyethyl acetoacetate; and β-diketones, such as acetylacetone, 2,4-hexanedione, 2,4-heptanedione, 3,5-heptanedione, and dipivaloylmethane. The usage amount of each of those nucleophilic reagents is preferably from 0.1 mol to 10 mol, more preferably from 1 mol to 4 mol with respect to 1 mol of the amount of the entire precursors because a high-quality thin-film can be produced with satisfactory productivity.

The thin-film forming raw material of the present invention is prevented from containing impurity metal elements other than the components forming the raw material, impurity halogens, such as impurity chlorine, and impurity organic substances to the extent possible. The content of each of the impurity metal elements is preferably 100 ppb or less, more preferably 10 ppb or less, and the total content thereof is preferably 1 ppm or less, more preferably 100 ppb or less because a high-quality thin-film can be produced with satisfactory productivity. In particular, when the raw material is used as a gate insulating film, a gate film, or a barrier layer of an LSI, it is required to reduce the contents of alkali metal elements and alkaline-earth metal elements that influence the electrical characteristics of a thin-film to be obtained. The content of the impurity halogens is preferably 100 ppm or less, more preferably 10 ppm or less, most preferably 1 ppm or less because a high-quality thin-film can be produced with satisfactory productivity. The total content of the impurity organic substances is preferably 500 ppm or less, more preferably 50 ppm or less, most preferably 10 ppm or less because a high-quality thin-film can be produced with satisfactory productivity. In addition, moisture causes generation of particles in the chemical vapor deposition raw material and generation of particles during thin-film formation. Accordingly, moisture in each of the precursor, the organic solvent, and the nucleophilic reagent is preferably removed as much as possible before its use. The moisture content of each of the precursor, the organic solvent, and the nucleophilic reagent is preferably 10 ppm or less, more preferably 1 ppm or less.

In addition, it is preferred that the thin-film forming raw material of the present invention be prevented from containing particles to the extent possible in order to reduce or prevent particle contamination of a thin-film to be formed. Specifically, in particle measurement with a light scattering liquid particle detector in a liquid phase, it is preferred that the number of particles larger than 0.3 μm be 100 or less in 1 mL of the liquid phase, it is more preferred that the number of particles larger than 0.2 μm be 1,000 or less in 1 mL of the liquid phase, and it is most preferred that the number of particles larger than 0.2 μm be 100 or less in 1 mL of the liquid phase.

Next, a method of producing a thin-film including using the thin-film forming raw material of the present invention is described. The method of producing a thin-film of the present invention includes forming a cobalt-containing thin-film on the surface of a substrate through use of the above-mentioned thin-film forming raw material of the present invention. More specifically, the method includes forming the cobalt-containing thin-film on the surface of the substrate through use of a raw material gas obtained by vaporizing the thin-film forming raw material of the present invention. The method of producing a thin-film of the present invention preferably includes: a raw material introduction step of introducing the raw material gas obtained by vaporizing the thin-film forming raw material into a film formation chamber having set therein the substrate; and a thin-film formation step of subjecting the cobalt compound represented by the general formula (1) in the raw material gas to decomposition and/or a chemical reaction, to thereby form the cobalt-containing thin-film on the surface of the substrate. Specifically, it is preferred that the method of producing a thin-film of the present invention be a CVD method including: introducing a raw material gas obtained by vaporizing the above-mentioned thin-film forming raw material and a reactive gas to be used as required into a film formation chamber (treatment atmosphere) having a substrate set therein; and then subjecting the precursor in the raw material gas to decomposition and/or a chemical reaction on the substrate, to thereby grow and deposit the cobalt-containing thin-film on the surface of the substrate. There are no particular limitations on a transportation and supply method for the raw material, a deposition method therefor, production conditions, a production apparatus, and the like, and well-known general conditions and methods may be used.

Examples of the above-mentioned reactive gas to be used as required include: oxidizing gases, such as oxygen, ozone, and water vapor; hydrocarbon compounds, such as methane and ethane; reducing gases, such as hydrogen, carbon monoxide, and an organic metal compound; and nitriding gases, such as organic amine compounds including a monoalkylamine, a dialkylamine, a trialkylamine, and an alkylenediamine, hydrazine, and ammonia. Those reactive gases may be used alone or as a mixture thereof. The cobalt compound represented by the general formula (1) has such a property as to react with a reducing gas in a satisfactory manner, and has such a property as to react with hydrogen in a particularly satisfactory manner. Accordingly, as the reactive gas, a reducing gas is preferably used, and hydrogen is particularly preferably used.

In addition, examples of the above-mentioned transportation and supply method include the gas transportation method, the liquid transportation method, the single source method, and the cocktail source method described above.

In addition, examples of the above-mentioned deposition method include: thermal CVD including causing a raw material gas, or the raw material gas and a reactive gas, to react only with heat, to thereby deposit a thin-film; plasma CVD using heat and plasma; optical CVD using heat and light; optical plasma CVD using heat, light, and plasma; and ALD including dividing a deposition reaction of CVD into elementary steps, and performing deposition at a molecular level in a stepwise manner.

As a material for the substrate, there are given, for example: silicon; ceramics, such as silicon nitride, titanium nitride, tantalum nitride, titanium oxide, ruthenium oxide, zirconium oxide, hafnium oxide, and lanthanum oxide; glass; and metals such as metal cobalt. The shape of the substrate is, for example, a plate shape, a spherical shape, a fibrous shape, or a scaly shape. The surface of the substrate may be planar, or may have a three-dimensional structure such as a trench structure.

In addition, examples of the above-mentioned production conditions include a reaction temperature (substrate temperature), a reaction pressure, and a deposition rate. The reaction temperature is preferably from room temperature to 500° C., more preferably from 100° C. to 400° C. because a high-quality thin-film can be produced with satisfactory productivity. In addition, the reaction pressure is preferably from 10 Pa to an atmospheric pressure in the case of the thermal CVD or the optical CVD, and is preferably from 10 Pa to 2,000 Pa in the case of using plasma because a high-quality thin-film can be produced with satisfactory productivity.

In addition, the deposition rate may be controlled by the supply conditions (vaporization temperature and vaporization pressure) of the raw material, the reaction temperature, and the reaction pressure. When the deposition rate is large, the characteristics of a thin-film to be obtained may deteriorate. When the deposition rate is small, a problem may occur in productivity. Accordingly, the deposition rate is preferably from 0.01 nm/min to 100 nm/min, more preferably from 0.1 nm/min to 50 nm/min. In addition, in the case of the ALD method, the deposition rate is controlled by the number of cycles so that a desired film thickness may be obtained.

Further, as the above-mentioned production conditions, there are given a temperature and a pressure when the thin-film forming raw material is vaporized to obtain a raw material gas. The step of vaporizing the thin-film forming raw material to obtain a raw material gas may be performed in the raw material container or in the vaporization chamber. In any case, it is preferred that the thin-film forming raw material of the present invention be evaporated at a temperature of from 0° C. to 150° C. In addition, when the thin-film forming raw material is vaporized to obtain a raw material gas in the raw material container or in the vaporization chamber, the pressure in the raw material container and the pressure in the vaporization chamber are both preferably from 1 Pa to 10,000 Pa because a high-quality thin-film can be produced with satisfactory productivity.

The method of producing a thin-film of the present invention is preferably a method including adopting the ALD method out of the CVD methods. When the method of producing a thin-film of the present invention is a method including adopting the ALD method, for example, it is preferred that the production method further include, between the raw material introduction step and the thin-film formation step described above, a precursor thin-film formation step of causing the thin-film forming raw material to be adsorbed to the surface of the substrate, to thereby form a precursor thin-film, and the thin-film formation step be a step of causing the precursor thin-film to react with a reactive gas, to thereby form the cobalt-containing thin-film on the surface of the substrate. Further, the method of producing a thin-film of the present invention more preferably includes an evacuation step of evacuating the unreacted raw material gas, the reactive gas, a by-product gas, and the like.

Now, regarding each step of the ALD method, the case of forming a metal cobalt film, which is one kind of cobalt-containing thin-film, is described in detail as an example. First, the above-mentioned raw material introduction step is performed. The preferred temperature and pressure when the thin-film forming raw material is turned into a raw material gas are the same as those described in the method of producing a thin-film by the CVD method. Next, the raw material gas introduced into the film formation chamber and the surface of the substrate are brought into contact with each other, and hence the precursor thin-film is formed on the surface of the substrate (precursor thin-film formation step).

In the precursor thin-film formation step, heat may be applied by heating the substrate or heating the film formation chamber. The temperature of the substrate in this case is preferably from room temperature to 500° C., more preferably from 100° C. to 400° C. The pressure of a system (in the film formation chamber) when this step is performed is preferably from 1 Pa to 10,000 Pa, more preferably from 10 Pa to 1,000 Pa. When the thin-film forming raw material includes the other precursor except the cobalt compound of the present invention, the other precursor also deposits on the surface of the substrate together with the cobalt compound of the present invention.

Next, the vapor of the thin-film forming raw material not having deposited on the surface of the substrate is evacuated from the film formation chamber (evacuation step). It is ideal that the unreacted vapor of the thin-film forming raw material and the gas generated as a by-product be completely evacuated from the film formation chamber, but it is not always required that the gases be completely evacuated. As an evacuation method, there are given, for example: a method including purging the inside of the system with an inert gas, such as nitrogen, helium, or argon; a method including performing evacuation by decompressing the inside of the system; and a combination of these methods. The degree of decompression when the decompression is performed is preferably from 0.01 Pa to 300 Pa, more preferably from 0.01 Pa to 100 Pa because a high-quality thin-film can be produced with satisfactory productivity.

Next, a reducing gas serving as the reactive gas is introduced into the film formation chamber, and the metal cobalt film is formed from the precursor thin-film obtained in the previous precursor thin-film formation step through the action of the reducing gas or the action of the reducing gas and heat (cobalt-containing thin-film formation step). In this step, the temperature when the heat is applied is preferably from room temperature to 500° C., more preferably from 100° C. to 400° C. because a high-quality thin-film can be produced with satisfactory productivity. The pressure of the system (in the film formation chamber) when this step is performed is preferably from 1 Pa to 10,000 Pa, more preferably from 10 Pa to 1,000 Pa because a high-quality thin-film can be produced with satisfactory productivity. The cobalt compound represented by the general formula (1) has satisfactory reactivity with the reducing gas, and hence a high-quality metal cobalt film containing less residual carbon can be obtained.

When the ALD method is adopted in the method of producing a thin-film of the present invention as described above, thin-film deposition performed by a series of operations consisting of the above-mentioned raw material introduction step, precursor thin-film formation step, evacuation step, and cobalt-containing thin-film formation step is defined as one cycle, and this cycle may be repeated a plurality of times until a thin-film having a required film thickness is obtained. In this case, it is preferred that, after one cycle is performed, a raw material gas and a reactive gas that are unreacted, and a gas generated as a by-product be evacuated from the film formation chamber in the same manner as in the above-mentioned evacuation step, and then the subsequent one cycle be performed.

In addition, in the formation of the metal cobalt film by the ALD method, energy, such as plasma, light, or a voltage, may be applied, and a catalyst may be used. There are no particular limitations on the timing for applying the energy and the timing for using the catalyst. The energy may be applied or the catalyst may be used, for example, at the time of introducing the raw material gas in the raw material introduction step, at the time of heating in the precursor thin-film formation step or the cobalt-containing thin-film formation step, at the time of evacuating the inside of the system in the evacuation step, or at the time of introducing the reducing gas in the cobalt-containing thin-film formation step, or between the above-mentioned respective steps.

In addition, in the method of producing a thin-film of the present invention, after the thin-film deposition, annealing treatment may be performed in an inert atmosphere, an oxidizing atmosphere, or a reducing atmosphere in order to obtain more satisfactory electrical characteristics. When step embedding is required, a reflow step may be provided. The temperature in this case is from 200° C. to 1,000° C., preferably from 250° C. to 500° C.

Figure 2:
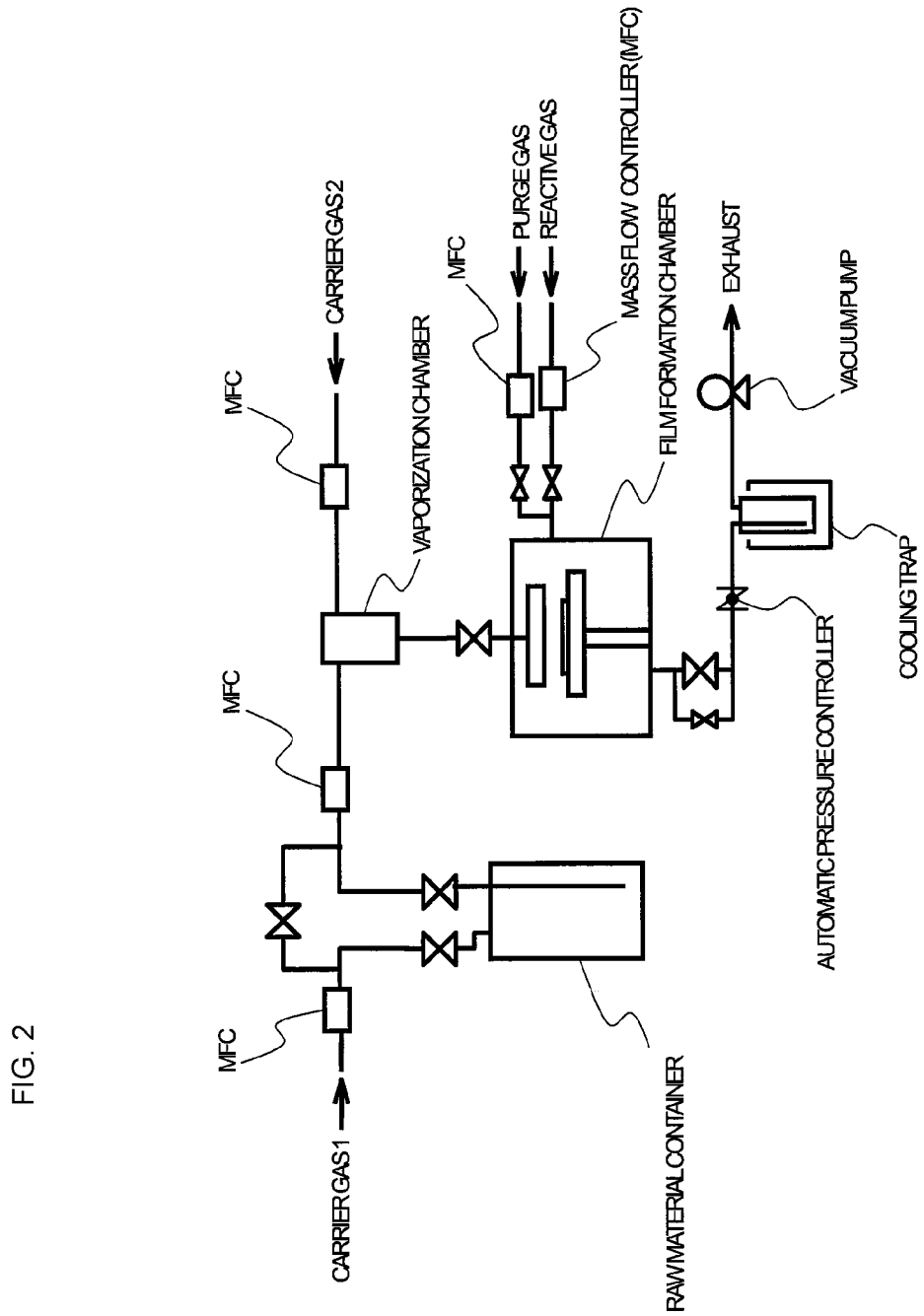
FIG. 2 is a schematic diagram for illustrating another example of the ALD apparatus to be used in the method of producing a thin-film according to the present invention.
Figure 3:
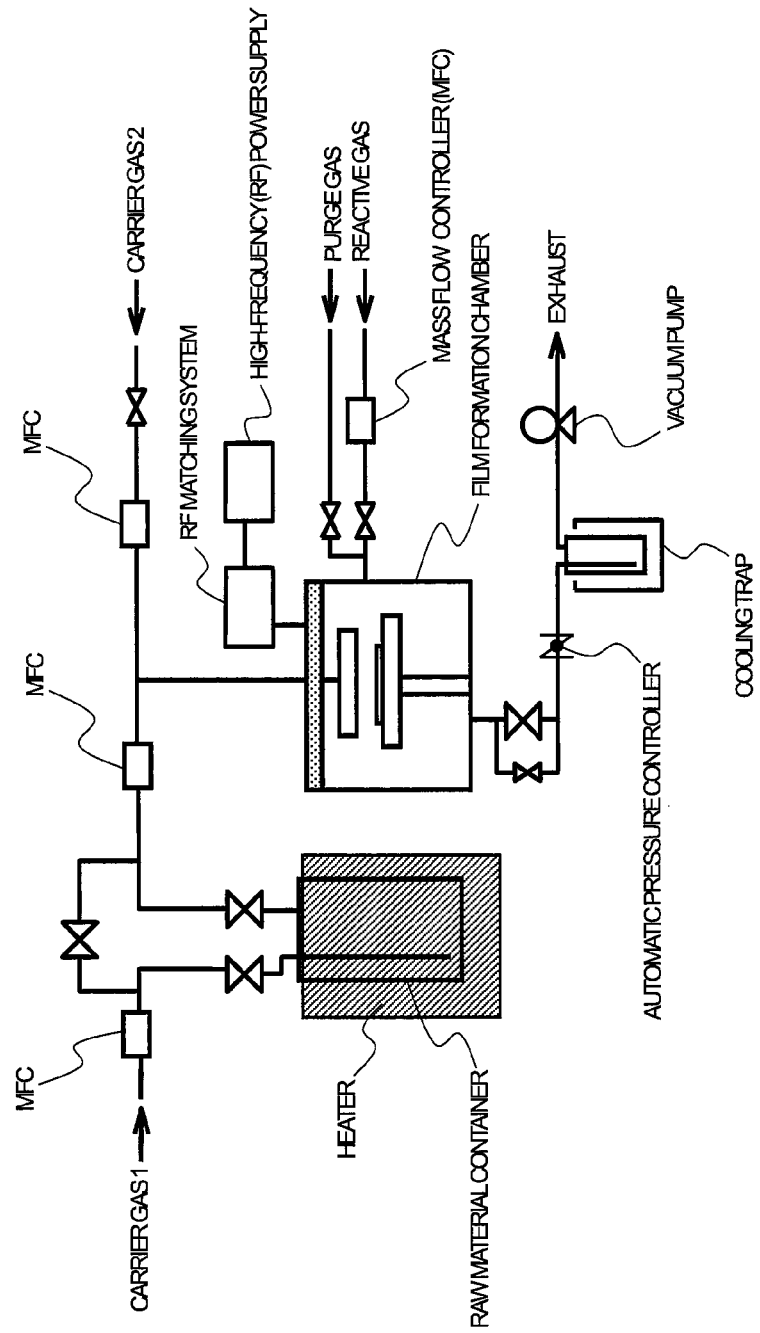
FIG. 3 is a schematic diagram for illustrating still another example of the ALD apparatus to be used in the method of producing a thin-film according to the present invention.
Figure 4:
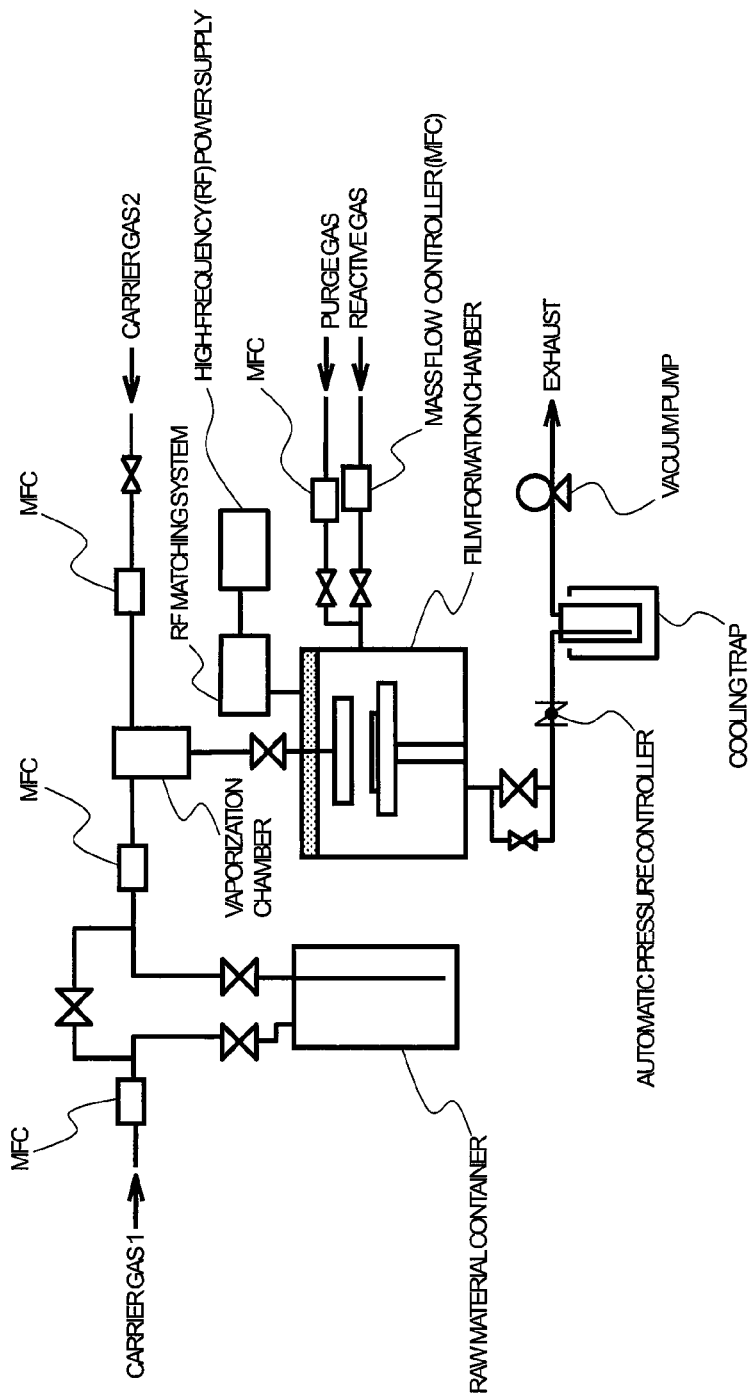
FIG. 4 is a schematic diagram for illustrating yet still another example of the ALD apparatus to be used in the method of producing a thin-film according to the present invention.

A well-known ALD apparatus may be used in the method of producing a thin-film of the present invention. Specific examples of the ALD apparatus include an apparatus capable of performing bubbling supply of a precursor as illustrated in FIG. 1 and FIG. 3 and an apparatus including a vaporization chamber as illustrated in FIG. 2 and FIG. 4. Another specific example thereof is an apparatus capable of subjecting the reactive gas to plasma treatment as illustrated in FIG. 3 and FIG. 4. The apparatus is not limited to such single-substrate type apparatus each including a film formation chamber as illustrated in FIG. 1 to FIG. 4, and an apparatus capable of simultaneously processing a large number of substrates through use of a batch furnace may also be used. Those apparatus may also be used as CVD apparatus.

A thin-film produced through use of the thin-film forming raw material of the present invention may be formed as desired kinds of thin-films, such as thin-films of a metal, oxide ceramics, nitride ceramics, and glass, by appropriately selecting the other precursor, the reactive gas, and the production conditions. It has been known that the thin-films exhibit electrical characteristics, optical characteristics, and the like, and the thin-films have been applied to various usages. Examples thereof include a metal thin-film, a metal oxide thin-film, a metal nitride thin-film, an alloy, and a metal-containing composite oxide thin-film. Those thin-films have been widely used in the production of, for example, an electrode material for a memory element typified by a DRAM element, a resistance film, a diamagnetic film used for the recording layer of a hard disk, and a catalyst material for a polymer electrolyte fuel cell.

EXAMPLES

The present invention is described in more detail below by way of Examples, Comparative Examples, and Evaluation Examples. However, the present invention is by no means limited by Examples and the like below.
<Production of Cobalt Compounds of the Present Invention>

The production results of cobalt compounds of the present invention are described in Examples 1 to 6 below.

[Example 1] Production of Cobalt Compound No. 42

0.73 Gram (0.0057 mol) of cobalt(II) chloride and 10 ml of tetrahydrofuran were loaded into a 500 mL four-necked flask under an Ar atmosphere, followed by stirring at room temperature. A solution prepared from 0.81 g (0.0057 mol) of (N-tert-butyl-N'-ethyl)acetamidine, 10 ml of tetrahydrofuran, and 3.5 ml (0.0057 mol) of a n-butyllithium-hexane solution was dropped thereinto under ice cooling. Next, a solution prepared from 0.87 g (0.0057 mol) of N,N-diethylpentane-2,4-diimine, 10 ml of tetrahydrofuran, and 3.5 ml (0.0057 mol) of a n-butyllithium-hexane solution was dropped thereinto under ice cooling. After the dropping, the temperature of the resultant was returned to room temperature, followed by stirring for 16 hours, exchange of the solvent with normal hexane, and then filtration. The solvent was removed from the resultant filtrate, and the residue was distilled at a bath temperature of 140° C. and a pressure of 50 Pa. Thus, Cobalt Compound No. 42 as a black solid was obtained. The yield amount and yield thereof were 0.9 g and 45%, respectively.
(Analysis Values)
(1) Elemental Analysis (Metal Analysis: ICP-AES)
   Co content: 16.9 mass % (theoretical value: 16.7 mass %)

[Example 2] Production of Cobalt Compound No. 45

3.99 Grams (0.0307 mol) of cobalt(II) chloride and 50 ml of tetrahydrofuran were loaded into a 100 mL three-necked flask under an Ar atmosphere, followed by stirring at room temperature. A solution prepared from 3.87 g (0.0307 mol) of diisopropylcarbodiimide, 50 ml of tetrahydrofuran, and 31 ml (0.0307 mol) of a methyllithium-diethyl ether solution was dropped thereinto under ice cooling. Next, a solution prepared from 3.87 g (0.0307 mol) of N,N-dimethylpentane-2,4-diimine, 50 ml of tetrahydrofuran, and 19.3 ml (0.0307 mol) of a n-butyllithium-hexane solution was dropped thereinto under ice cooling. After the dropping, the temperature of the resultant was returned to room temperature, followed by stirring for 16 hours, exchange of the solvent with normal hexane, and then filtration. The solvent was removed from the resultant filtrate, and the residue was distilled at a bath temperature of 125° C. and a pressure of 43 Pa. Thus, Cobalt Compound No. 45 as a black solid was obtained. The yield amount and yield thereof were 1.26 g and 13%, respectively.
(Analysis Values)
(1) Elemental Analysis (Metal Analysis: ICP-AES)
   Co content: 18.0 mass % (theoretical value: 18.1 mass %)

[Example 3] Production of Cobalt Compound No. 46

0.80 Gram (0.0062 mol) of cobalt(II) chloride and 10 ml of tetrahydrofuran were loaded into a 100 mL three-necked flask under an Ar atmosphere, followed by stirring at room temperature. A solution prepared from 0.78 g (0.0062 mol) of diisopropylcarbodiimide, 10 ml of tetrahydrofuran, and 6.2 ml (0.0062 mol) of a methyllithium-diethyl ether solution was dropped thereinto under ice cooling. Next, a solution prepared from 0.95 g (0.0062 mol) of N,N-diethylpentane-2,4-diimine, 10 ml of tetrahydrofuran, and 3.8 ml (0.0062 mol) of a n-butyllithium-hexane solution was dropped thereinto under ice cooling. After the dropping, the temperature of the resultant was returned to room temperature, followed by stirring for 16 hours, exchange of the solvent with normal hexane, and then filtration. The solvent was removed from the resultant filtrate, and the residue was distilled at a bath temperature of 125° C. and a pressure of 60 Pa. Thus, Cobalt Compound No. 46 as a black liquid was obtained. The yield amount and yield thereof were 0.16 g and 8.0%, respectively.
(Analysis Values)
(1) Elemental Analysis (Metal Analysis: ICP-AES)
   Co content: 17.0 mass % (theoretical value: 16.7 mass %)

[Example 4] Production of Cobalt Compound No. 47

0.68 Gram (0.0052 mol) of cobalt(II) chloride and 10 ml of tetrahydrofuran were loaded into a 100 mL three-necked flask under an Ar atmosphere, followed by stirring at room temperature. A solution prepared from 0.66 g (0.0052 mol) of diisopropylcarbodiimide, 10 ml of tetrahydrofuran, and 5.2 ml (0.0052 mol) of a methyllithium-diethyl ether solution was dropped thereinto under ice cooling. Next, a solution prepared from 0.96 g (0.0052 mol) of N,N-diisopropylpentane-2,4-diimine, 10 ml of tetrahydrofuran, and 3.3 ml (0.0052 mol) of a n-butyllithium-hexane solution was dropped thereinto under ice cooling. After the dropping, the temperature of the resultant was returned to room temperature, followed by stirring for 16 hours, exchange of the solvent with normal hexane, and then filtration. The solvent was removed from the resultant filtrate, and the residue was distilled at a bath temperature of 155° C. and a pressure of 39 Pa. Thus, Cobalt Compound No. 47 as a black liquid was obtained. The yield amount and yield thereof were 1.20 g and 60%, respectively.
(Analysis Values)
(1) Elemental Analysis (Metal Analysis: ICP-AES)
   Co content: 15.6 mass % (theoretical value: 15.5 mass %)

[Example 5] Production of Cobalt Compound No. 57

0.68 Gram (0.006 mol) of cobalt(II) chloride and 10 ml of tetrahydrofuran were loaded into a 100 mL three-necked flask under an Ar atmosphere, followed by stirring at room temperature. A solution prepared from 1.03 g (0.006 mol) of (N-tert-butyl-N'-1,1,1-trifluoroethyl)acetamidine, 10 ml of tetrahydrofuran, and 3 ml (0.006 mol) of a n-butyllithiumhexane solution was dropped thereinto under ice cooling. Next, a solution prepared from 0.66 g (0.006 mol) of N,N-diethylpentane-2,4-diimine, 10 ml of tetrahydrofuran, and 3 ml (0.006 mol) of a n-butyllithium-hexane solution was dropped thereinto under ice cooling. After the dropping, the temperature of the resultant was returned to room temperature, followed by stirring for 16 hours, exchange of the solvent with normal hexane, and then filtration. The solvent was removed from the resultant filtrate, and the residue was distilled at a bath temperature of 110° C. and a pressure of 32 Pa. Thus, Cobalt Compound No. 57 as a brown liquid was obtained. The yield amount and yield thereof were 0.10 g and 4.4%, respectively.
(Analysis Values)
(1) Elemental Analysis (Metal Analysis: ICP-AES)
   Co content: 15.9 mass % (theoretical value: 15.5 mass %)

[Example 6] Production of Cobalt Compound No. 93

0.68 Gram (0.0052 mol) of cobalt(II) chloride and 10 ml of tetrahydrofuran were loaded into a 100 mL three-necked flask under an Ar atmosphere, followed by stirring at room temperature. A solution prepared from 0.66 g (0.0052 mol) of diisopropylcarbodiimide, 10 ml of tetrahydrofuran, and 5.2 ml (0.0052 mol) of a methyllithium-diethyl ether solution was dropped thereinto under ice cooling. Next, a solution prepared from 0.96 g (0.0052 mol) of N-methyl-N'-(2-dimethylaminoethyl)pentane-2,4-diimine, 10 ml of tetrahydrofuran, and 3.4 ml (0.0052 mol) of a n-butyllithium-hexane solution was dropped thereinto under ice cooling. After the dropping, the temperature of the resultant was returned to room temperature, followed by stirring for 16 hours, exchange of the solvent with normal hexane, and then filtration. The solvent was removed from the resultant filtrate, and the residue was distilled at a bath temperature of 150° C. and a pressure of 40 Pa. Thus, Cobalt Compound No. 93 as a black liquid was obtained. The yield amount and yield thereof were 0.05 g and 2.5%, respectively.
(Analysis Values)
(1) Elemental Analysis (Metal Analysis: ICP-AES)
   Co content: 15.8 mass % (theoretical value: 15.4 mass %)

Evaluation Examples

The cobalt compounds of the present invention obtained in Examples 1 to 6 and Comparative Compound 1 described below were each subjected to the following evaluations.
(1) Melting Point Evaluation
The state of each of the compounds at 25° C. was visually observed. When the compound was a solid at 25° C., its melting point was measured with a minute melting point-measuring device. It can be judged that a compound having a low melting point is excellent in transportability, and is hence preferred as a thin-film forming raw material. The results are shown in Table 1.
(2) Temperature at the Time of 50 Mass % Loss in Normal-Pressure TG-DTA (° C.)
The weight of a test compound was measured with a TG-DTA under normal pressure at an Ar flow rate of 100 mL/min and a temperature increase rate of 10° C./min in the scanning temperature range of from 30° C. to 600° C., and the temperature (° C.) at which the weight of the test compound reduced by 50 mass % was evaluated as a "temperature (° C.) at the time of a 50 mass % loss in normal-pressure TG-DTA". It can be judged that a compound having a low temperature at the time of a 50 mass % loss in normal-pressure TG-DTA has a high vapor pressure, and is hence preferred as a thin-film forming raw material. The results are shown in Table 1.

Comparative Compound 1

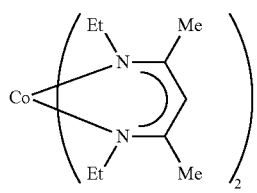

TABLE 1

| Compound | State at 25° C. | Melting point [° C.] | Temperature at the time of 50 mass % loss in normal-pressure TG-DTA [° C.] |
|---|---|---|---|
| Evaluation Example 1 | Compound No. 42 | Solid | 38 | 226 |
| Evaluation Example 2 | Compound No. 45 | Solid | 66 | 195 |
| Evaluation Example 3 | Compound No. 46 | Liquid | — | 221 |
| Evaluation Example 4 | Compound No. 47 | Liquid | — | 231 |
| Evaluation Example 5 | Compound No. 57 | Liquid | — | 229 |
| Evaluation Example 6 | Compound No. 93 | Liquid | — | 219 |
| Comparative Evaluation Example 1 | Comparative Compound 1 | Solid | 43 | 252 |

As shown in Table 1 above, it was found that while Comparative Compound 1 had a temperature at the time of a 50 mass % loss in normal-pressure TG-DTA of 250° C. or more, the cobalt compounds of the present invention obtained in Examples 1 to 6 each had a temperature at the time of a 50 mass % loss in normal-pressure TG-DTA of less than 235° C., and hence each had a high vapor pressure. In addition, it was found that while Comparative Compound 1 had a melting point of 43° C., Cobalt Compounds No. 42, No. 46, No. 47, No. 57, and No. 93 each had a melting point of less than 40° C., and hence each had a low melting point. It was found that Cobalt Compounds No. 46, No. 47, No. 57, and No. 93 out of those compounds were each in a liquid state at 25° C., and hence each had a particularly low melting point.
<Production of Thin-Films by ALD Method>

Metal cobalt thin-films were each produced on a silicon substrate by the ALD method under the following conditions through use of an apparatus illustrated in FIG. 1 with each of the cobalt compounds of the present invention obtained in Examples 1 to 6 and Comparative Compounds 1 and 2 being used as a chemical vapor deposition raw material. Regarding each of the obtained thin-films, a film thickness was measured by an X-ray reflectivity method, a compound of the thin-film was identified by an X-ray diffraction method, and the content of carbon in the thin-film was measured by X-ray photoelectron spectroscopy. The results are shown in Table 3.

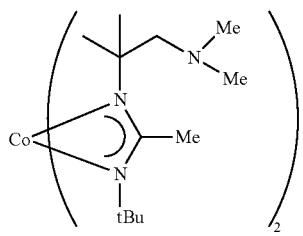

Comparative Compound 2

[Examples 7 to 12 and Comparative Examples 1 and 2] Production of Metal Cobalt Thin-Films by ALD Method (Conditions)
Reaction temperature (substrate temperature): 200° C., reactive gas: hydrogen (Steps)
A series of the following steps (1) to (4) was defined as one cycle, and this cycle was repeated 50 times:
(1) vapor (raw material gas) of a chemical vapor deposition raw material vaporized under the conditions of a raw material container heating temperature of 90° C. and a raw material container internal pressure of 100 Pa is introduced, and the chemical vapor deposition raw material is deposited on the substrate at a system pressure of 100 Pa for 30 seconds (raw material introduction step and precursor thin-film formation step);
(2) an unreacted raw material gas is removed through argon purging for 10 seconds (evacuation step);
(3) the reactive gas is introduced, and the precursor thin-film and the reactive gas are caused to react with each other at a system pressure of 100 Pa for 30 seconds (thin-film formation step); and
(4) the unreacted reactive gas and a by-product gas are removed through argon purging for 10 seconds (evacuation step).

TABLE 2

| | Chemical vapor deposition raw material | Thickness of thin-film | Compound of thin-film | Carbon content in thin-film |
|---|---|---|---|---|
| Example 7 | Compound No. 42 | 4.7 nm | Metal cobalt | Undetectable*[1] |
| Example 8 | Compound No. 45 | 3.7 nm | Metal cobalt | Undetectable*[1] |
| Example 9 | Compound No. 46 | 5.2 nm | Metal cobalt | Undetectable*[1] |
| Example 10 | Compound No. 47 | 4.2 nm | Metal cobalt | Undetectable*[1] |
| Example 11 | Compound No. 57 | 3.8 nm | Metal cobalt | Undetectable*[1] |
| Example 12 | Compound No. 93 | 3.6 nm | Metal cobalt | Undetectable*[1] |
| Comparative Example 1 | Comparative Compound 1 | 2.2 nm | Metal cobalt | 3 atm % |
| Comparative Example 2 | Comparative Compound 2 | 2.0 nm | Metal cobalt | 4 atm % |

*[1]The detection limit is 0.1 atm %.

While the carbon content in the metal cobalt film obtained by the ALD method was 3 atm % or more in each of Comparative Examples 1 and 2, the carbon content was less than the detection limit, that is, 0.1 atm % in each of Examples 7 to 12. In other words, it was shown that the use of the cobalt compound of the present invention provided a high-quality thin-film. In addition, while the thickness of the resultant thin-film was 2.2 nm or less in each of Comparative Examples 1 and 2, the thickness was 3.5 nm or more in each of Examples 7 to 12. In other words, it was shown that the use of the cobalt compound of the present invention provided a thin-film with high productivity. In each of Examples 7, 9, and 10 out of the above-mentioned Examples, the thickness of the resultant thin-film was 4.0 nm or more, and the metal cobalt film was obtained with higher productivity. Further, in each of Examples 7 and 9, the thickness of the resultant thin-film was 4.5 nm or more, and the metal cobalt film was obtained with still higher productivity. Particularly in Example 9, the thickness of the resultant thin-film was 5.0 nm or more, and the metal cobalt film was obtained with particularly high productivity.

As described above, it was shown that the cobalt compounds of the present invention each had a low melting point and a high vapor pressure, and further, were each able to produce a thin-film with high productivity when used as a chemical vapor deposition raw material, and hence were each excellent as a chemical vapor deposition raw material. It was shown that Cobalt Compounds No. 42, No. 46, and No. 47 out of the cobalt compounds each had a low melting point and a high vapor pressure, and further, were each able to produce a thin-film with higher productivity when used as a chemical vapor deposition raw material, and hence were each more excellent as a chemical vapor deposition raw material. Further, it was shown that Cobalt Compounds No. 42 and No. 46 each had a low melting point and a high vapor pressure, and further, were each able to produce a thin-film with still higher productivity when used as a chemical vapor deposition raw material, and hence were each still more excellent as a chemical vapor deposition raw material. In particular, it was shown that Cobalt Compound No. 46 had a low melting point and a high vapor pressure, and further, was able to produce a thin-film with particularly high productivity when used as a chemical vapor deposition raw material, and hence was particularly excellent as a chemical vapor deposition raw material. In addition, it was shown that the thin-film forming raw materials of the present invention were each particularly suitable for the ALD method.

The invention claimed is:

1. A cobalt compound represented by the following general formula (1):

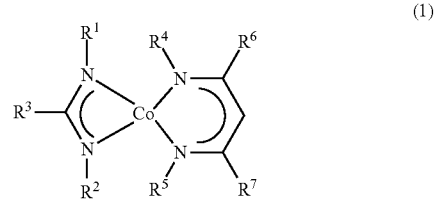

where $R^1$ to $R^7$ each independently represent a hydrogen atom, a halogen atom, an alkyl group having 1 to 5 carbon atoms, a fluorine atom-containing alkyl group having 1 to 5 carbon atoms, a group represented by the following general formula (L-1), or a group represented by the following general formula (L-2);

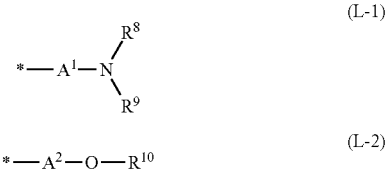

$$* \text{—} A^2 \text{—} O \text{—} R^{10} \quad (L\text{-}2)$$

where $R^8$ to $R^{10}$ each independently represent an alkyl group having 1 to 5 carbon atoms, $A^1$ and $A^2$ each independently represent an alkanediyl group having 1 to 5 carbon atoms, and represents a bonding site.

2. The cobalt compound according to claim 1, wherein, in the general formula (1), $R^1$, $R^2$, $R^4$, and $R^5$ each independently represent an alkyl group having 1 to 5 carbon atoms, a fluorine atom-containing alkyl group having 1 to 5 carbon atoms, a group represented by the general formula (L-1), or a group represented by the general formula (L-2), and $R^3$, $R^6$, and $R^7$ each independently represent a hydrogen atom, a halogen atom, or an alkyl group having 1 to 5 carbon atoms.

3. A thin-film forming raw material, comprising the cobalt compound of claim 1.

4. A method of producing a thin-film, comprising forming a thin-film containing a cobalt atom on a surface of a substrate through use of the thin-film forming raw material of claim 3.

5. The method of producing the thin-film according to claim 4, wherein the method comprises:
   introducing a raw material gas obtained by vaporizing the thin-film forming raw material into a film formation chamber having set therein the substrate; and
   subjecting the cobalt compound represented by the general formula (1) in the raw material gas to decomposition and/or a chemical reaction, to thereby form the thin-film containing a cobalt atom on the surface of the substrate.

6. The method of producing the thin-film according to claim 5,
   wherein the method further comprises, between the raw material introduction and the thin-film formation, forming a precursor thin-film on the surface of the substrate through use of the thin-film forming raw material, and
   wherein during the thin-film formation, causing the precursor thin-film to react with a reactive gas, to thereby form the thin-film containing a cobalt atom on the surface of the substrate.

7. A thin-film forming raw material, comprising the cobalt compound of claim 2.

* * * * *